US008766364B2

(12) United States Patent
Doornbos et al.

(10) Patent No.: US 8,766,364 B2
(45) Date of Patent: Jul. 1, 2014

(54) FIN FIELD EFFECT TRANSISTOR LAYOUT FOR STRESS OPTIMIZATION

(75) Inventors: Gerben Doornbos, Leuven (BE); Mark van Dal, Heverlee (BE)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/600,369

(22) Filed: Aug. 31, 2012

(65) Prior Publication Data

US 2014/0061801 A1 Mar. 6, 2014

(51) Int. Cl.
*H01L 27/12* (2006.01)
(52) U.S. Cl.
USPC ..................... 257/351; 257/E27.06
(58) Field of Classification Search
USPC .......................................................... 257/351
See application file for complete search history.

(56) References Cited

U.S. PATENT DOCUMENTS

| 6,787,406 | B1 * | 9/2004 | Hill et al. | 438/164 |
|---|---|---|---|---|
| 6,914,277 | B1 * | 7/2005 | Hill et al. | 257/213 |
| 6,974,983 | B1 * | 12/2005 | Hill et al. | 257/292 |
| 7,235,436 | B1 * | 6/2007 | Lin et al. | 438/154 |
| 7,491,589 | B2 * | 2/2009 | Anderson et al. | 438/157 |
| 2011/0169101 | A1 | 7/2011 | Doornbos et al. | |
| 2012/0299106 | A1 * | 11/2012 | Mann | 257/351 |
| 2013/0026572 | A1 * | 1/2013 | Kawa et al. | 257/347 |

OTHER PUBLICATIONS

Unpublished U.S. Appl. No. 13/162,316, filed Jun. 16, 2011 entitled "Mask-less and Implant Free Formation of Complementary Tunnel Field Effect Transistors" 41 pages.
A. Shimizu et al., "Local Mechanical-Stress Control (LMC): A New Technique for CMOS-Performance Enhancement" IEDM 01-433, 2001 IEEE, 19.4.1-19.4.4.
T.Ghani et al., "A 90nm High Volume Manufacturing Logic Technology Featuring Novel 45 nm Gate Length Strained Silicon CMOS Transistors", IEDM 03, 2003 IEEE, 11.6.1-11.6.3.
K. Ota et al., "Stress Controlled Shallow Trench Isolation Technology to Suppress the Novel Anti-Isotropic Impurity Diffusion for 45-nm-node High-Performance CMOSFETs", 2005 Symposium on VLSI Technology Digest of Technical Papers, pp. 138-139.
C. Ortolland et al., Stress Memorization Technique (SMT) Optimization for 45nm CMOS, 2006 Symposium on VLSI Technology Digest of Technical Papers, 2006 IEEE, 2 pages.
G. Vellianitis et al., "Gatestacks for Scaleable High-Performance FinFETs", 2007 IEEE, pp. 681-684.

(Continued)

*Primary Examiner* — Lex Malsawma
(74) *Attorney, Agent, or Firm* — Haynes and Boone, LLP

(57) ABSTRACT

The present disclosure describes a layout for stress optimization. The layout includes a substrate, at least two fin field effect transistors (FinFET) cells formed in the substrate, a FinFET fin designed to cross the two FinFET cells, a plurality of gates formed on the substrate, and an isolation unit formed between the first FinFET cell and the second FinFET cell. The two FinFET cells include a first FinFET cell and a second FinFET cell. The FinFET fin includes a positive charge FinFET (Fin PFET) fin and a negative charge FinFET (Fin NFET) fin. The isolation unit isolates the first FinFET cell from the second FinFET cell without breaking the FinFET fin.

20 Claims, 12 Drawing Sheets

(56) References Cited

OTHER PUBLICATIONS

G. Eneman et al., "High Mobility $Si_{1-x}Ge_x$-Channel PFETs: Layout Dependence and Enhanced Scalability, Demonstrating 90% Performance Boost at Narrow Widths", 2010 Symposium on VLSI Technology Digest of Technical Papers, 2010 IEEE, pp. 41-42.

A. Oishi et al. "High Performance CMOSFET Technology for 45nm Generation and Scalability of Stress-Induced Mobility Enhancement Technique", 2005 IEEE, 4 pages.

N. Serra et al., "Experimental and Physics-Based Modeling Assessment of Strain Induced Mobility Enhancement in FinFETs", 2009 IEEE, IEDM09-71-IEDM09-74.

* cited by examiner

FIN FIELD EFFECT TRANSISTOR LAYOUT FOR STRESS OPTIMIZATION

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

For example, the scaling down of a fin field effect transistor (FinFET) faces challenges of a stress relaxation of a channel between a source and a drain of the FinFET due to a finite length of a fin of the FinFET. The channel relaxation reduces channel stress and further reduces mobility of a charge moving in the channel. The low mobility of the charge moving in the change further reduces a performance of the FinFET. Accordingly, what is needed is a device for further scaling down of the FinFET.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

DETAILED DESCRIPTION

Figure 1:
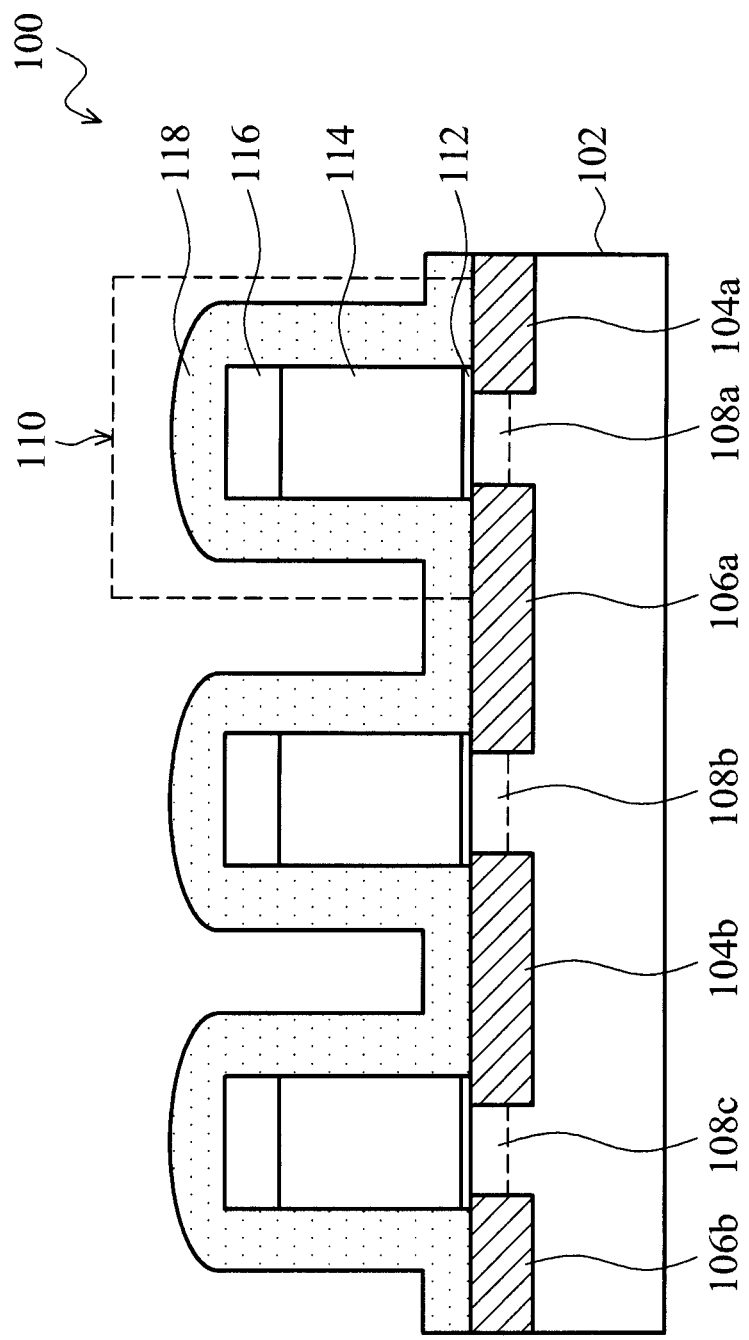
FIG. 1 is a cross-sectional side view of a field effect transistor (FET) device according to one or more embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring now to FIG. 1, a cross-sectional side view of a field effect transistor (FET) device 100 is illustrated according to one or more embodiments of the present disclosure. The device includes a substrate 102, sources 104a-b, drains 106a-b, channels 108a-c, a gate stack 110, and a stress liner 118. The gate stack 110 includes a gate oxide layer 112, a poly gate layer 114, a metal gate layer 116, and a stress liner 118. However, other configurations and inclusion or omission of devices may be possible. In the present disclosure, the FET device 100 is also referred to as a metal oxide semiconductor (MOS) device. In the present embodiment, the substrate 102 includes a wafer and/or a plurality of conductive and non-conductive thin films. The wafer is a semiconductor substrate including silicon (in other words, a silicon wafer). Alternatively or additionally, the wafer includes another elementary semiconductor, such as germanium; a compound semiconductor including silicon carbide, gallium arsenide, gallium phosphide, indium phosphide, indium arsenide, gallium antimonide, and/or indium antimonide; an alloy semiconductor including SiGe, GaAsP, AlInAs, AlGaAs, GaInAs, GaInP, and/or GaInAsP. In yet another alternative, the wafer is a semiconductor on insulator (SOI). The plurality of conductive and non-conductive thin films may comprise an insulator or a conductive material. For example, the conductive material comprises a metal such as aluminum (Al), copper (Cu), tungsten (W), nickel (Ni), titanium (Ti), gold (Au), and platinum (Pt) and, thereof an alloy of the metals. The insulator material may include silicon oxide and silicon nitride. The substrate 102 further includes various doped features, such as n-type wells and/or p-type wells, formed by ion implantation and/or diffusion. The substrate 102 also includes various isolation features, such as shallow trench isolation (STI), formed by a process, such as a process including etching to form various trenches and then depositing to fill the trench with a dielectric material.

As shown in FIG. 1, the sources 104a-b and the drains 106a-b are formed in the substrate 102. The sources 104a-b and the drains 106a-b include an n-type dopant or a p-type dopant, formed by ion implantation or other suitable process. For example, the sources 104a-b and the drains 106a-b are formed in a common ion implantation procedure. In another example, the sources 104a-b and the drains 106a-b are formed by an epitaxial (EPI) growth with an in situ ion implantation process. The channels 108a-c are formed in the substrate 102. The channels 108a-c include various doped features, such as n-type channel or p-type channel. The channels 108a-c are electrically conductive, and charges can flow between the sources 104a-b and the drains 106a-b when a voltage is applied on the metal gate layer 116, and on the sources 104a-b or the drain 106a-b.

The gate stack 110 is formed on the substrate 102. The gate stack 110 crosses over the channels 108a, partially overlaps with portion of the sources 104a at one side of the channels 108a, and partially overlaps with portion of the drains 106a at another side of the channels 108a. The gate stack 110 is formed by a process including depositing or growing to form multiple layers of film on the substrate 102, patterning a resist film deposited on the substrate 102, and etching the patterned resist film to form the gate stack 110. The gate oxide layer 112 is deposited on the substrate 102. The gate oxide layer 112 includes a silicon oxide. Other materials, such as high dielectric (high k) material are possible candidates. The metal gate layer 116 is deposited on the gate oxide layer 112. The metal gate layer 116 includes a metal or a metal alloy. The poly gate layer 114 is deposited on the metal gate layer 116. The poly gate layer 114 may include a polysilicon or other material.

As shown in FIG. 1, in one embodiment, the stress liner layer 118 is deposited over the gate stack 110 to increase a desired longitudinal component of a channel stress (Sx) in order to improve a speed performance of the FET device 100. High channel stress (Sx) means high moving mobility of a positive charge or negative charge in the channels 108a-c. However, if a space between two gate stacks is fully filled with the stress liner layer 118, the desired longitudinal component of a channel stress (Sx) is decreased to approximate zero. The decreasing of the channel stress (Sx) limits the scalability of the FinFET device 100. In another embodiment, the sources 104a-b and the drains 106a-b are formed by a SiGe EPI growth with the in situ P+ ion implantation. The embedded SiGe source/drain can increase a current between a source and a train. However, the SiGe EPI growth with the in situ ion implantation can be only used for fabricating a positive charge MOS (PMOS). A complementary negative charge MOS (NMOS) is not available by this process.

Figure 2:
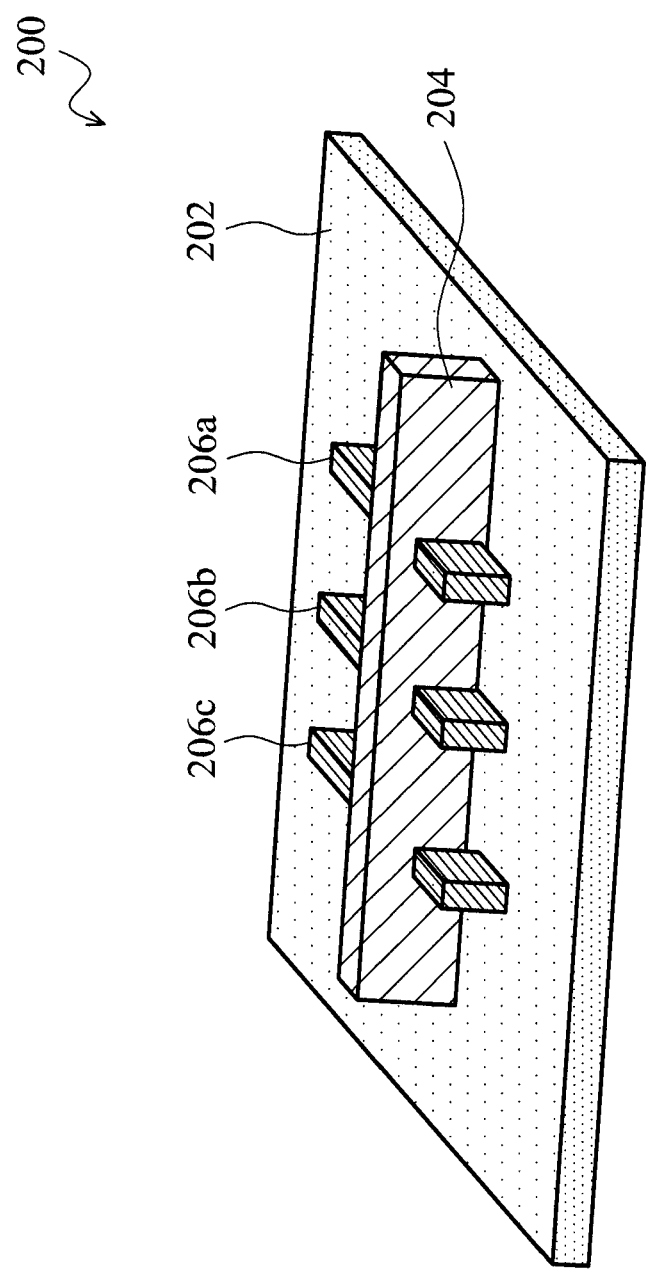
FIG. 2 is a diagram of a FinFET (FinFET) device according to one or more embodiments of the present disclosure.

Referring to FIG. 2, a diagram of a fin (like) field effect transistor (FinFET) device 200 is illustrated according to one or more embodiments of the present disclosure. The FinFET device 200 includes a substrate 202, a FinFET gate 204, and multiple sources/drains 206a-c. However, other configurations and inclusion or omission of devices may be possible. In the present disclosure, a FinFET gate is also referred to as a fin gate, trigate, or as a FinFET. The substrate 202 includes all materials used in the substrate 102 of the device 100 with reference to FIG. 1. The FinFET gate 204 is formed on the substrate 202 using a deposition process, a lithography process, an etching process, a chemical mechanical polishing (CMP) process, a cleaning process, or combination thereof. The FinFET gate 204 may include an oxide layer, a high k layer, a poly gate layer, a metal gate layer, or a combination thereof. The FinFET gate 204 may cross at least one of the multiple sources/drains 206a-c. The multiple sources/drains 206a-c are embedded in the substrate 202 using a deposition process, a lithography process, an etching process, a chemical mechanical polishing (CMP) process, an ion implantation process, a cleaning process, or combination thereof.

As shown in FIG. 2, the FinFET gate 204 may include a positive charge FinFET (Fin PFET) gate, a negative charge FinFET (Fin NFET) gate, or both. In some embodiments, a ion implantation process may include an EPI growth with an in situ ion implantation process, such as a Ge EPI growth with in situ P+ ion implantation for a PMOS, to form a Fin PFET gate. In other embodiments, an ion implantation process may include an EPI growth with an in situ ion implantation process, such as an InAs EPI growth with an in situ ion N+ ion implantation for a NMOS, to form a Fin NFET gate.

Figure 3:
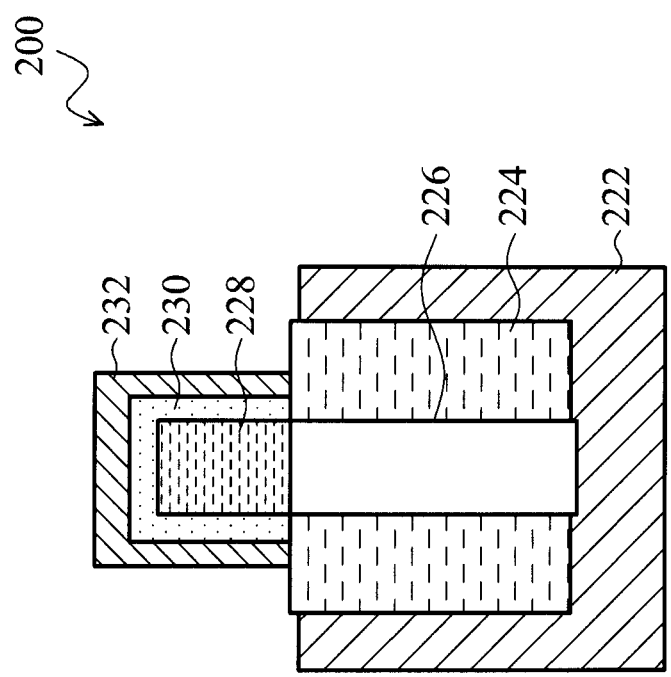
FIG. 3 is a cross sectional side view of a FinFET device according to one or more embodiments of the present disclosure.

Referring to FIG. 3, a cross sectional view of a FinFET device 220 is illustrated according to one or more embodiments of the present disclosure. The FinFET device 200 includes a substrate 222, a shallow trench isolation (STI) 224, a strain relaxed buffer (SRB) 226, a channel 228, a high k layer 230, and a gate layer 232. However, other configurations and inclusion or omission of devices may be possible. The substrate 222 includes all materials used in the substrate 102 of the device 100 with reference to FIG. 1. The STI 224 is embedded into the substrate 222 using a deposition process, a lithography process, an etching process, a chemical mechanical polishing (CMP) process, a cleaning process, or combination thereof. The STI 224 may include silicon oxide, silicon nitride, or silicon oxynitride (ONSi).

As shown in FIG. 3, the SRB 226 is formed in the substrate 222 using a deposition process, a growth process, a lithography process, an etching process, a chemical mechanical polishing (CMP) process, a cleaning process, or combination thereof. The SRB 226 may include Si, SiGe, InAlAs, or InP. The channel 228 is formed on the substrate 222 using a deposition process, a growth process, a lithography process, an etching process, a chemical mechanical polishing (CMP) process, a cleaning process, or combination thereof. The channel 228 is located on top of the SRB 226. The channel 228 provides a path for a charge traveling from a source to a drain. The channel 228 may include Si, SiGe, Ge, InGaAs, InGaSb, InAsSb. The high k layer 230 is deposited to surround the channel 228. The high k layer 230 may include a silicon oxide, a metal oxide, a metal nitride, or a combination thereof. The gate layer 232 is deposited to surround the high k layer 230. The gate layer 232 may include a polysilicon, a metal, or a metal alloy.

As shown in FIG. 3, a material for the SRB 226 or the channel 228 is adjustable to increase stress of the channel 228. According to some embodiments, high stress of the channel 228 means high mobility of the charge moving along the channel 228 and further means high performance of the device 220. For example, the SRB 226 includes a SiGe mixture having approximate 50% of Si and approximate 50% of Ge. The channel 228 of the FinFET gate 204 includes a mixture having approximate 75% of Si and approximate 25% of Ge for a Fin NFET gate. The channel 228 of the FinFET gate 204 includes a mixture having approximate 25% of Si and approximate 75% of Ge for a Fin PFET gate. In another example, the SRM 226 includes a SiGe mixture having approximate 75% of Si and approximate 25% of Ge. The channel 228 includes a Ge compound for a Fin PFET gate of the FinFET device 220. The channel 228 may include a mixture having approximate 50% of Si and approximate 50% of Ge for a Fin NFET gate of the FinFET device 220. In another example, The SRB 226 includes a SiGe mixture having 75% of Si and approximate 25% of Ge, and the channel 228 includes a Ge compound for a Fin PFET gate of the FinFET device 220. The SRB 226 includes a mixture of InAlAs/InP, and the channel 228 includes InGaAs for a Fin NFET gate of the FinFET device 220.

Figure 4:
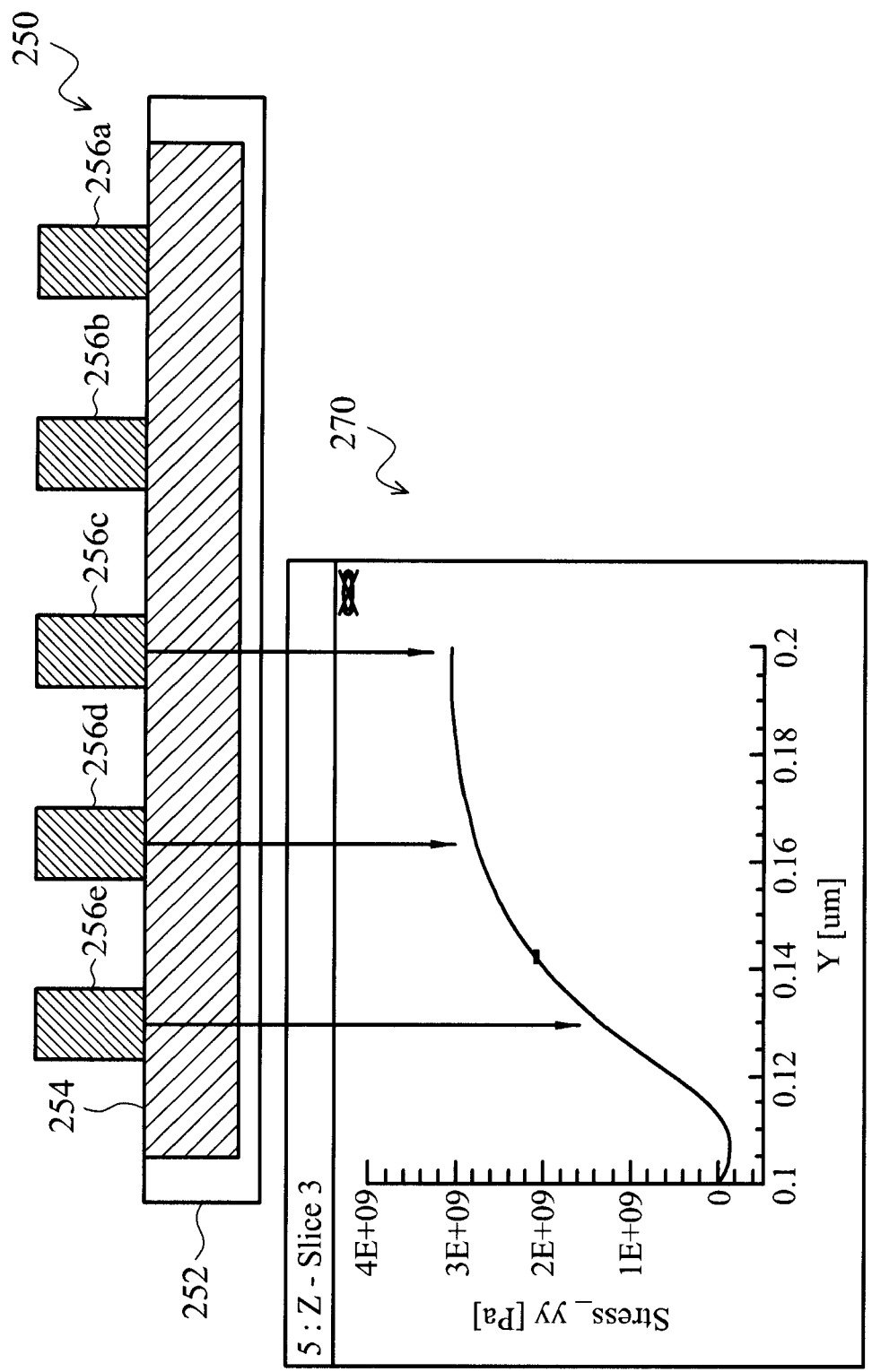
FIG. 4 is a stress simulation result of a FinFET device according to one or more embodiments of the present disclosure.

In some embodiments, the stress in the channel 228 of the FinFET device 220 may relax towards a fin end. The relaxation may become even worse with increasing height of a FinFET channel. FIG. 4 is an example of a simulation 270 performed on a FinFET device 250 according to one or more embodiments of the present disclosure. The FinFET device 250 includes a substrate 252, a channel 254, and FinFET gates 256a-e. However, other configurations and inclusion or omission of devices may be possible. The substrate 252 includes all the materials used in the substrate 102 of the device 100 with reference to FIG. 1. The channel 254 is formed in the substrate 252 using a deposition process, a growth process, a lithography process, an etching process, a chemical mechanical polishing (CMP) process, a ion implantation process, a cleaning process, or combination thereof. The channel 254 includes a channel for a Fin PFET gate or a channel for a Fin NFET gate. As shown in FIG. 4, the FinFET gate 256c has the highest channel stress due to the FinFET gate 256c is at a middle portion of a fin. The FinFET gate 256a or 256e has the lowest channel stress due to the FinFET gate 256a or 256e being close to a fin end. The FinFET gate 256b or 256d has a moderate channel stress due to the FinFET gate 256b or 256d being located between the middle portion of the fin and the fin end.

Figure 5:
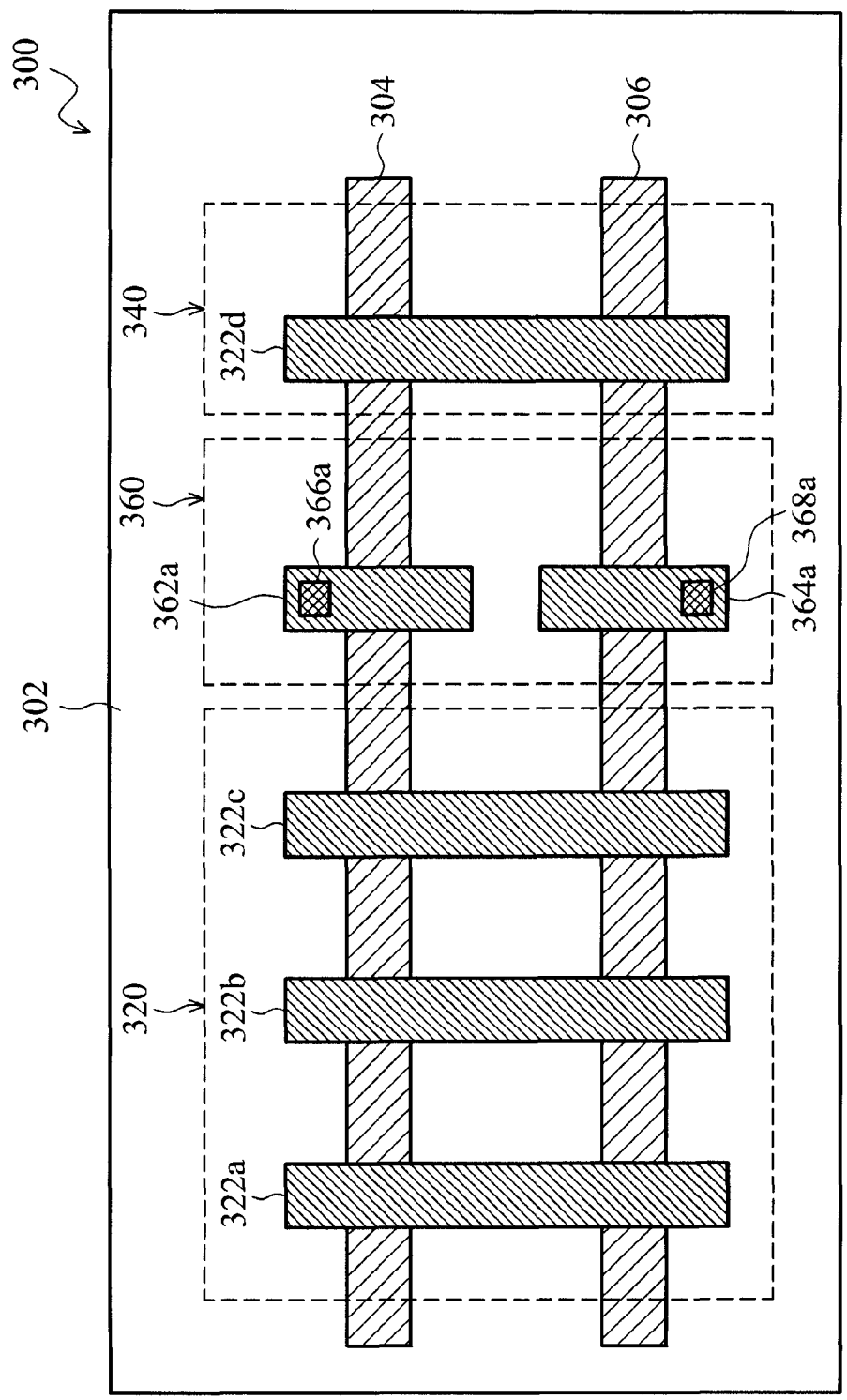
FIGS. 5-12 are layouts of FinFET device for implementing one or more embodiments of the present disclosure.

Referring to FIG. 5, a layout of a FinFET device 300 is illustrated for implementing one or more embodiments of the present disclosure. The FinFET device 300 includes a substrate 302, a Fin PFET 304, a Fin NFET 306, first FinFET cell 320, second FinFET cell 340, and a FinFET isolation unit 360. The first FinFET cell 320 includes multiple gates 322a-322c. The second FinFET cell 340 includes multiple gates 322d. The FinFET isolation unit 360 includes a first P-gate isolation structure 362a, a first N-gate isolation structure 364a, a metal contact 366a, and a metal contact 368a. However, other configurations and inclusion or omission of devices may be possible. In the present disclosure, a FinFET device is also referred to as a fin layout or a fin device. In some embodiments, the first FinFET cell 320 or the second FET cell 340 includes a logic or a function cell, such as an AND, an OR, a NAND, a NOR, an inverter, a DRAM or a SRAM cell. The FinFET isolation unit 360 can be used for more logic or function cells isolation on a FinFET device.

As shown in FIG. 5, the substrate 302 includes all the materials used in the substrate 102 of the device 100 with reference to FIG. 1. The Fin PFET 304 and the Fin NFET 306 are formed on the substrate 302 crossing the first FinFET cell 320 and the second FinFET cell 340 respectively and are shared by the first FinFET cell 320 and the second FinFET cell 340. The multiple gates 322a-d cross the Fin PFET 304 and the Fin NFET 306 and form gates for the Fin PFET 304 and the Fin NFET 306 respectively in the substrate 302. The Fin PFET 304, the Fin NFET 306, and the multiple gates 322a-d form the first FinFET cell 320 and the second FinFET cell 340 of the FinFET device 300 in the substrate 302. In one embodiment, the first FET cell 320 is a 3×1 NAND logic cell and the second FET cell 340 is a 1×1 inverter as shown in FIG. 5.

As shown in FIG. 5, the first P-gate isolation structure 362a is formed in the Fin PFET 304. The first P-gate isolation structure 362a is connected on the contact 366a formed on the substrate 302. The first P-gate isolation structure 362a is designed to turn off the Fin PFET gate 304. Turning off the Fin PFET 304 at the first P-gate isolation structure 362a is equivalent to cutting the Fin PFET gate 304 at a location of first P-gate isolation structure 362a. Therefore, a channel of the Fin PFET gate 304 is continuous, and stress of the channel of the Fin PFET gate 304 is maintained. Further, a performance of the Fin PFET gate 304 is improved. When a voltage (Vgp) applied to the first P-gate isolation structure 362a is approximately equal to a voltage (Vdd) applied to the Fin PFET gate 304, the Fin PFET gate 304 is turned off at the first P-gate isolation structure 362a. The first N-gate isolation structure 364a is connected on contact 368a formed on the substrate 302. The first N-gate isolation structure 364a is designed to turn off the Fin NFET gate 306. Turning off the Fin NFET 304 at the first N-gate isolation structure 364a is equivalent to cutting the Fin NFET gate 306 at a location of the first N-gate isolation structure 364a. Therefore, a channel of the Fin NFET gate 306 is continuous, and a stress of the channel of the Fin NFET gate 306 is maintained. Further, a performance of the Fin PNET gate 306 is improved. When a voltage (Vgn) applied to first N-gate isolation structure 364a is approximately equal to a voltage (Vss) applied to the Fin NFET gate 306, the Fin NFET gate 306 is turned off at the first N-gate isolation structure 364a.

As shown in FIG. 5, a dimension of the first P-gate isolation structure 362a or the first N-gate isolation structure 364a can be increased for further improving the isolation of the Fin PFET gate 304 or the Fin NFET gate 306. In one embodiment, a dimension in a horizontal direction of the first P-gate isolation structure 362a or the first N-gate isolation structure 364a is increased for improving the isolation the Fin PFET gate 304 or the Fin NFET gate 306.

Figure 6:
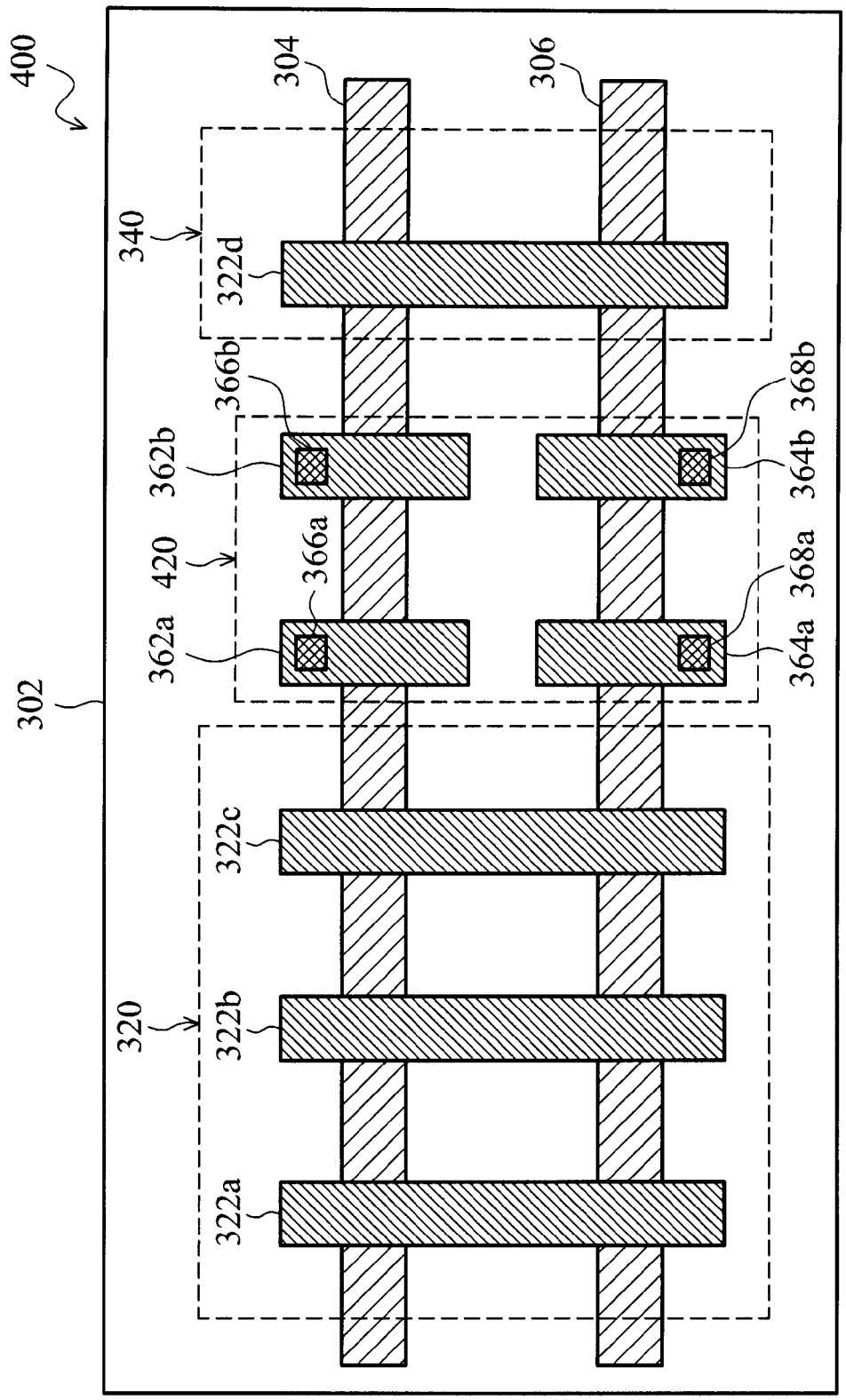

In some embodiments, the FinFET isolation unit may include more than one P-gate or N-gate isolation structures as shown in FIG. 6. FIG. 6 is a layout example of a FinFET device 400 for implementing one or more embodiments of the present disclosure. The FinFET device 400 includes the substrate 302, the Fin PFET gate 304, the Fin NFET gate 306, the first FinFET cell 320, the second FinFET cell 340, and a FinFET isolation unit 420. The first FinFET cell 320 includes multiple gates 322a-322c. The second FinFET cell 340 includes multiple gates 322d. The FinFET isolation unit 420 includes a first P-gate isolation structure 362a, a second P-gate isolation structure 362b, a contact 366a connecting the first P-gate isolation structure 362a, and a contact 366b connecting the second P-gate isolation structure 362b. The FinFET isolation unit 420 also includes a first N-gate isolation structure 364a, a second N-gate isolation structure 364b, a contact 368a connecting the first N-gate isolation structure 364a, and a contact 368b connecting the second N-gate isolation structure 364b. However, other configurations and inclusion or omission of devices may be possible. In some embodiments, the first FinFET cell 320 or the second FET cell 340 includes a logic or a function cell, such as an AND, an OR, a NAND, a NOR, an inverter, a DRAM or a SRAM cell. The FinFET isolation unit 420 can be used for more logic or function cells isolation on a FinFET device.

Figure 7:
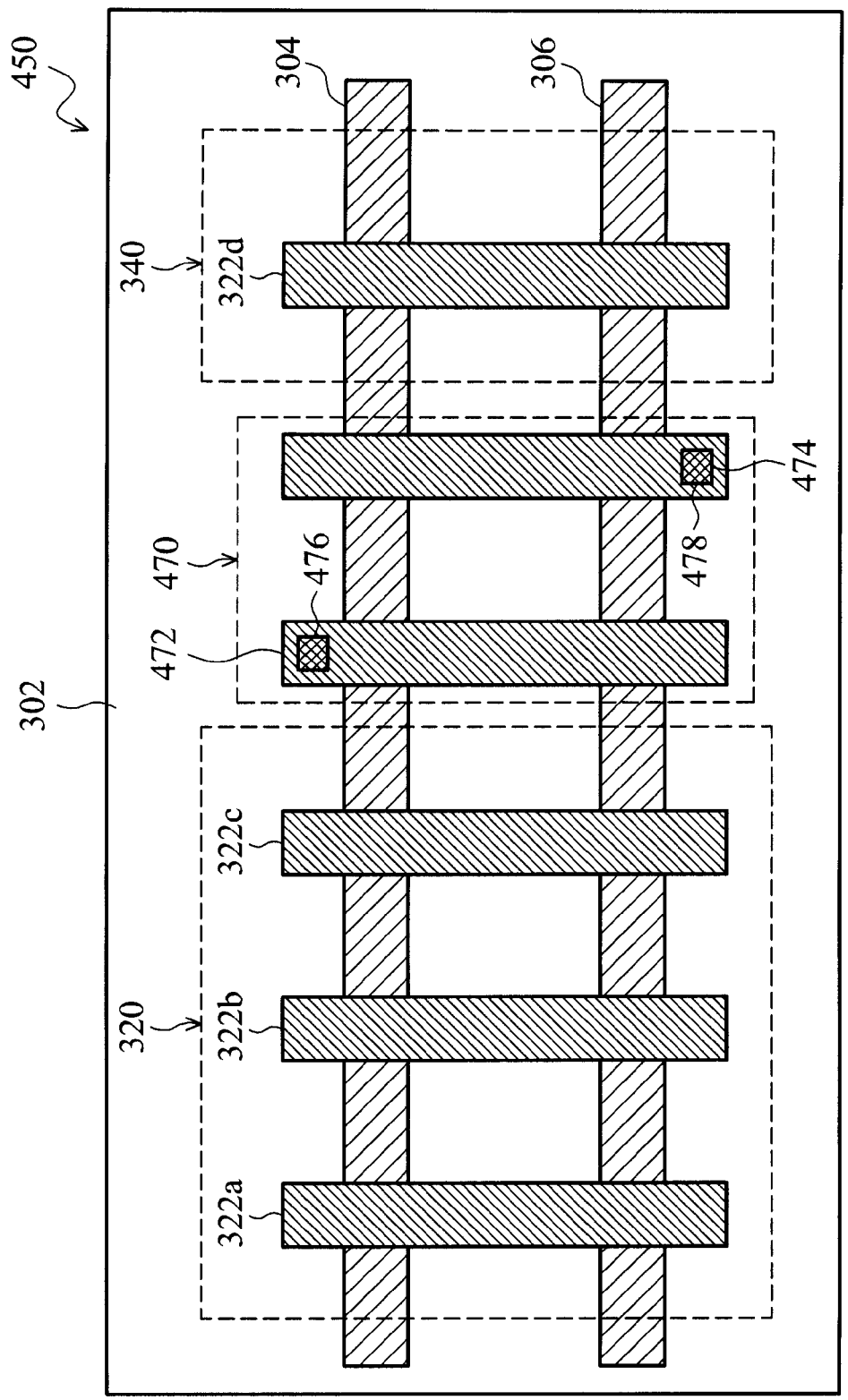

In other embodiments, a FinFET isolation unit may include extending a P-gate or N-gate isolation structure as shown in FIG. 7. FIG. 7 is a layout example of a FinFET device 450 for implementing one or more embodiments of the present disclosure. The FinFET device 450 includes the substrate 302, the Fin PFET gate 304, the Fin NFET gate 306, the first FinFET cell 320, the second FinFET cell 340, and a FinFET isolation unit 470. The first FinFET cell 320 includes multiple gates 322a-322c. The second FinFET cell 340 includes multiple gates 322d. The FinFET isolation unit 470 includes an extended P-gate isolation structure 472 and a contact 476 connecting the extended P-gate isolation structure 472 for improving the isolation between the first FinFET cell 320 and the second FinFET cell 340. The extended P-gate isolation structure 472 reaches and crosses the Fin NFET 306. The FinFET isolation unit 470 also includes an extended N-gate isolation structure 474 and a contact 478 connecting the extended N-gate isolation structure 474 for improving the isolation between the first FinFET cell 320 and the second FinFET cell 340. The extended N-gate isolation structure 474 reaches and crosses the Fin PFET 304. However, other configurations and inclusion or omission of devices may be possible. In the depicted embodiment, the first FinFET cell 320 or the second FET cell 340 includes a logic or a function cell, such as an AND, an OR, a NAND, a NOR, an inverter, a DRAM or a SRAM cell. The FinFET isolation unit 470 can be used for more logic or function cells isolation on a FinFET device. The FinFET isolation unit 470 may include more than one extended P-gate or N-gate isolation structure.

Figure 8:
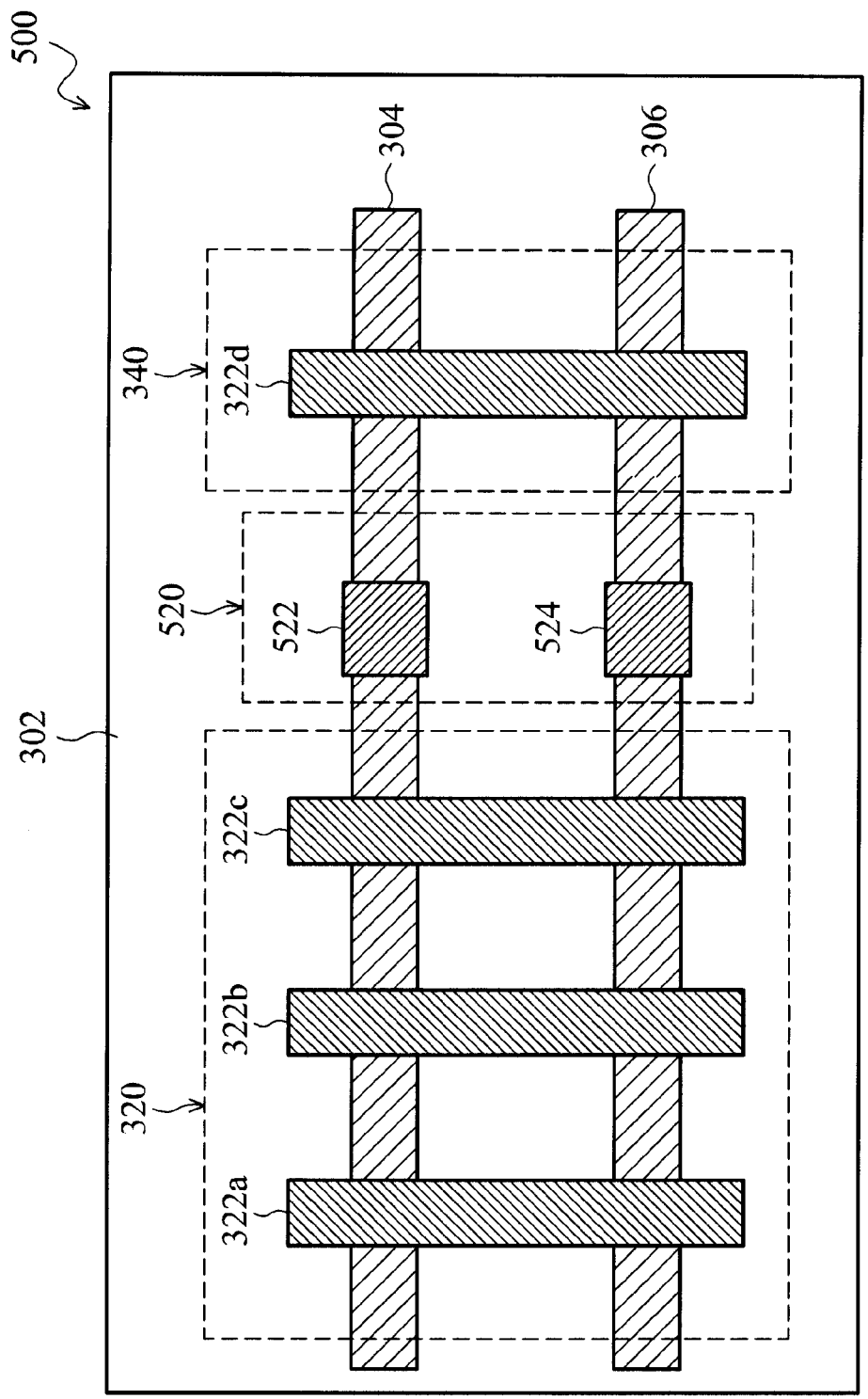

In some embodiments, the FinFET isolation unit may include a doped well or a counter doping of a FinFET gate for an isolation between two FinFET cells. FIG. 8 is a layout example of a FinFET device 500 for implementing one or more embodiments of the present disclosure. The FinFET device 500 includes the substrate 302, the Fin PFET 304, the Fin NFET 306, the first FinFET cell 320, the second FinFET cell 340, and a FinFET isolation unit 520. The first FinFET cell 320 includes multiple gates 322a-322c. The second FinFET cell 340 includes multiple gates 322d. The FinFET isolation unit 520 includes an N-WELL isolation structure 522 isolating the Fin PFET 304 between the first FinFET cell 320 and the second FinFET cell 340. The FinFET isolation unit 520 also includes a P-WELL isolation structure 524 isolating the Fin NFET 306 between the first FinFET cell 320 and the second FinFET cell 340. However, other configurations and inclusion or omission of devices may be possible. The N-WELL isolation structure 522 or the P-WELL isolation structure 524 is formed in the substrate 302 using a mask. In the depicted embodiment, the first FinFET cell 320 or the second FET cell 340 includes a logic or a function cell, such as an AND, an OR, a NAND, a NOR, an inverter, a DRAM or a SRAM cell. The FinFET isolation unit 520 can be used for more logic or function cells isolation on a FinFET device. The FinFET isolation unit 520 may include more than one N-WELL or P-WELL isolation structure. A dimension of the N-WELL isolation structure 522 or the P-WELL isolation structure 524 can be increased for further improving isolation of the Fin PFET 304 or the Fin NFET 306 between the first FinFET cell 320 and the second FinFET cell 340.

Figure 9:
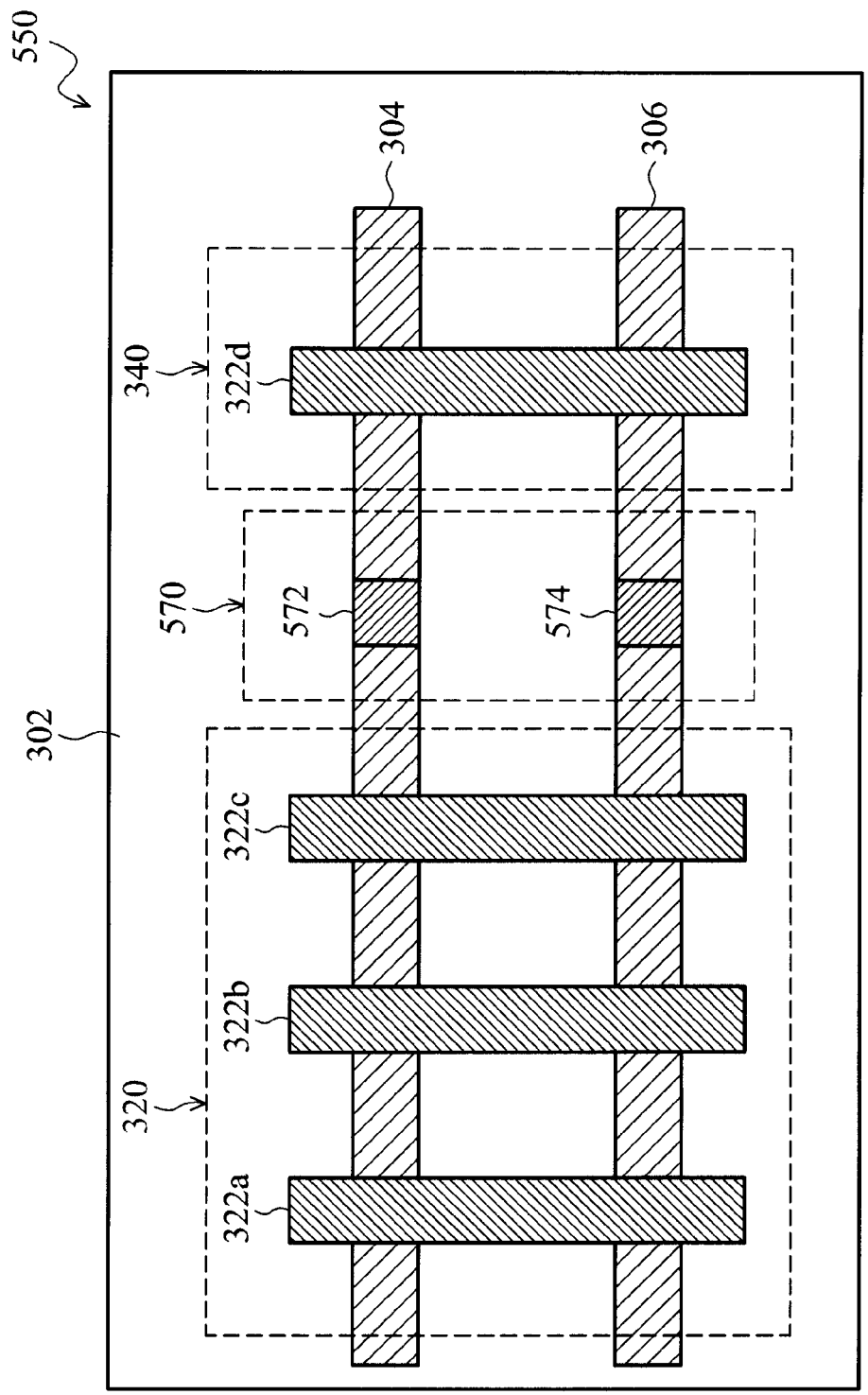

FIG. 9 is a layout example of a FinFET device 550 for implementing one or more embodiments of the present disclosure. The FinFET device 550 includes the substrate 302, the Fin PFET 304, the Fin NFET 306, the first FinFET cell 320, the second FinFET cell 340, and a FinFET isolation unit 570. The first FinFET cell 320 includes multiple gates 322a-322c. The second FinFET cell 340 includes multiple gates 322d. The FinFET isolation unit includes an N+ isolation structure 572 and a P+ isolation structure 574. However, other configurations and inclusion or omission of devices may be possible. The N+ isolation structure 572 isolates the Fin PFET 304 between the first FinFET cell 320 and the second FinFET cell 340. The P+ isolation structure 574 isolates the Fin NFET 306 between the first FinFET cell 320 and the second FinFET cell 340. The N+ isolation structure 572 or the P+ isolation structure 574 is formed in the substrate 302 using a mask and an ion implantation. The N+ isolation structure 572 is a counter doping of the Fin PFET 304. The P+ isolation structure 574 is a counter doping of the Fin NFET 306.

In the depicted embodiment, the first FinFET cell 320 or the second FET cell 340 includes a logic or a function cell, such as an AND, an OR, a NAND, a NOR, an inverter, a DRAM or a SRAM cell. The FinFET isolation unit 570 can be used for more logic or function cells isolation on a FinFET device. A dimension of the N+ isolation structure 572 or the P+ isolation structure 574 can be increased for further improving isolation of the Fin PFET 304 or the Fin NFET 306 between the first FinFET cell 320 and the second FinFET cell 340. The FinFET isolation unit 570 may include more than one N+ isolation structure 572 or more than one P+ isolation structure 574.

Figure 10:
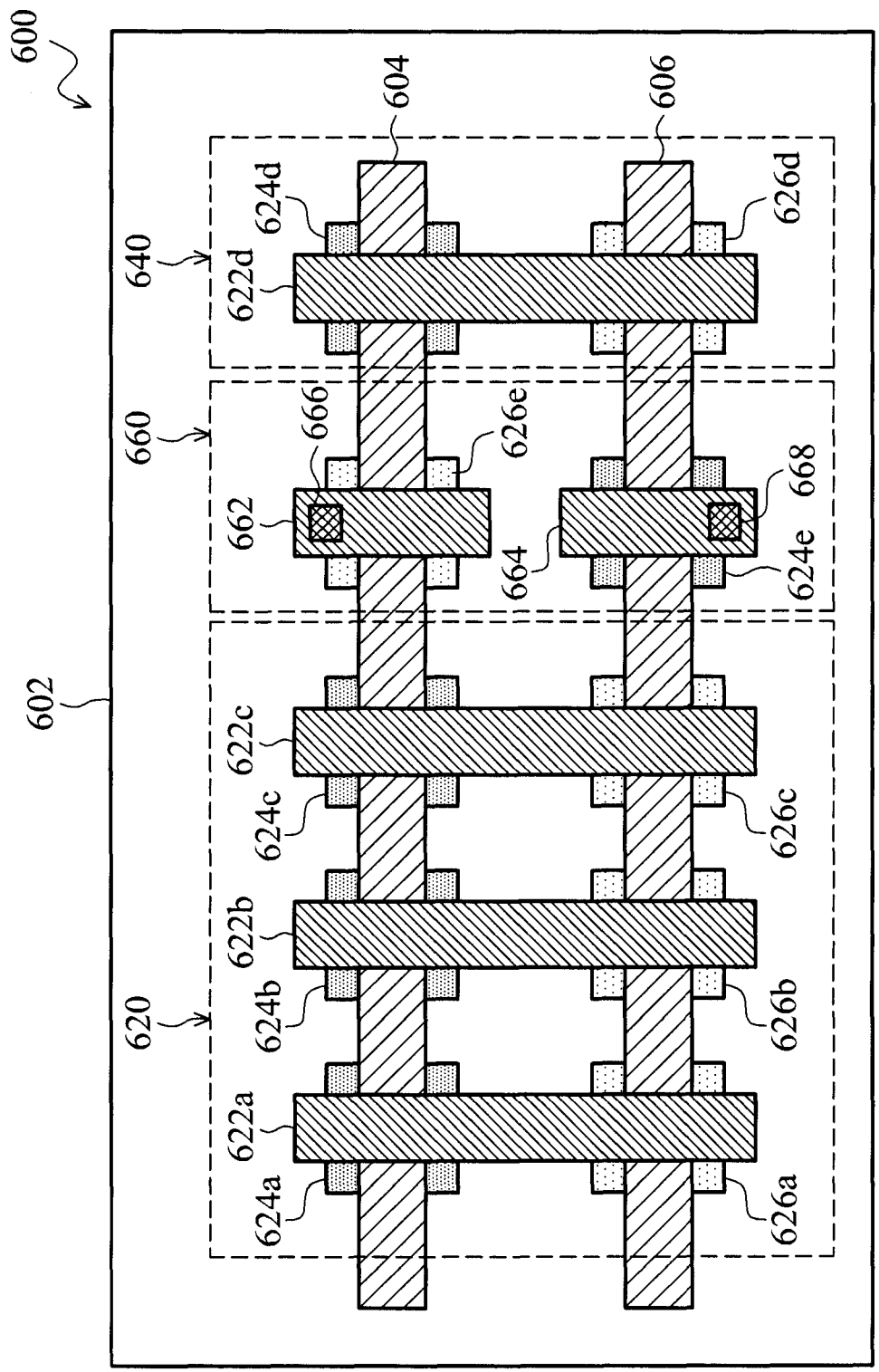

Referring to FIG. 10, a layout of a FinFET device 600 is illustrated for implementing one or more embodiments of the present disclosure. The FinFET device 600 includes a substrate 602, a Fin PFET 604, a Fin NFET 606, first FinFET cell 620, second FinFET cell 640, and a FinFET isolation unit 660. The FinFET device 600 also includes first gate stacks 624a-e and second gate stacks 626a-e. The first FinFET cell 620 includes multiple gates 622a-622c. The second FinFET cell 640 includes multiple gates 622d. The FinFET isolation unit 660 includes a P-gate isolation structure 662, a N-gate isolation structure 664, a contact 666, and a contact 668. However, other configurations and inclusion or omission of devices may be possible. In the present disclosure, a FinFET device is also referred to as a layout or a device. In some embodiments, the first FinFET cell 620 or the second FET cell 640 includes a logic or a function cell, such as an AND, an OR, a NAND, a NOR, an inverter, a DRAM or a SRAM cell. The FinFET isolation unit 660 can be used for more logic or function cells isolation on a FinFET device.

As shown in FIG. 10, the substrate 602 includes all the materials used in the substrate 102 of the device 100 with reference to FIG. 1. The Fin PFET 604 and the Fin NFET 606 are formed on the substrate 602 crossing the first FinFET cell 620 and the second FinFET cell 640 respectively and are shared by the first FinFET cell 620 and the second FinFET cell 640. The multiple gates 622a-d cross the Fin PFET 604 and the Fin NFET 606 and form gates for the Fin PFET 604 and the Fin NFET 606 respectively in the substrate 602. In some embodiments, the first gate stacks 624a-e include a first metal gate material. The second gate stacks 626a-e include a second metal gate material. The first metal gate material is different from the second metal gate material at work function. The Fin PFET 604 includes the first gate stacks 624a-d. The Fin NFET 606 includes the second gate stacks 626a-d. The Fin PFET 604, the Fin NFET 606, and the multiple gates 622a-d form the first FinFET cell 620 and the second FinFET cell 640 of the FinFET device 600 in the substrate 602. In one embodiment, the first FET cell 620 is a 3×1 NAND logic cell, and the second FET cell 640 is a 1×1 inverter.

As shown in FIG. 10, the P-gate isolation structure 662 is formed in the Fin PFET 604. The P-gate isolation structure 662 includes the second gate stack 626e. The P-gate isolation structure 662 is also connected to the contact 666 formed on the substrate 602. The P-gate isolation structure 662 is designed to turn off the Fin PFET 604. Turning off the Fin PFET 604 at the P-gate isolation structure 662 is equivalent to cutting the Fin PFET 604 at location of the P-gate isolation structure 662. Therefore, a channel of the Fin PFET 604 is continuous, and channel stress of the Fin PFET 604 is maintained. Further, a performance of the Fin PFET 604 is improved. When a voltage (Vgp) applied to the first P-gate isolation structure 662 is approximately equal to a voltage (Vdd) applied to the Fin PFET 604, the Fin PFET 604 is turned off at the P-gate isolation structure 662. The second gate stack 626e of the P-gate isolation structure 662 has a different work function comparing to the first gate stacks 624a-d of the Fin PFET gate 604. A different work function between the first gate stacks 624a-d and the second gate stack 626e can create a high threshold voltage (Vt) and creates an improved isolation between the first FinFET cell 620 and the second FinFET cell 640 at the P-gate isolation structure 662.

As shown in FIG. 10, the N-gate isolation structure 664 is formed in the Fin PFET 606. The N-gate isolation structure 664 includes the first gate stack 624e. The N-gate isolation structure 664 is connected to the contact 628 formed on the substrate 602. The N-gate isolation structure 664 is designed to turn off the Fin NFET 606. Turning off the Fin NFET 606 at the N-gate isolation structure 664 is equivalent to cutting the Fin NFET 606 at location of the N-gate isolation structure 664. Therefore, a channel of the Fin NFET 606 is continuous, and channel stress of the Fin NFET 606 is maintained. Further, a performance of the Fin PNET 606 is improved. When a voltage (Vgn) applied to N-gate isolation structure 664 is approximately equal to a voltage (Vss) applied to the Fin NFET 606, the Fin NFET 606 is turned off at the N-gate isolation structure 664. The first gate stack 624e of the N-gate isolation structure 664 has a different work function compared to the second gate stacks 626a-d of the Fin NFET gate 606. A different work function between the second gate stacks 626a-d and the first gate stack 624e can create a high threshold voltage (Vt) and creates an improved isolation between the first FinFET cell 620 and the second FinFET cell 640 at the N-gate isolation structure 664.

As shown in FIG. 10, a dimension of the P-gate isolation structure 662 or the N-gate isolation structure 664 can be increased for further improving the isolation of the Fin PFET 604 or the Fin NFET 606. In one embodiment, a dimension in a horizontal direction of the P-gate isolation structure 662 or the N-gate isolation structure 664 is increased for improving the isolation the Fin PFET 604 or the Fin NFET 606. In some embodiments, the isolation unit 660 can include more than one P-gate isolation structure 662 or more than one N-gate isolation structure 664. In other embodiments, a gate metal material of the first gate stack 624a-e and a gate metal material of the second gate stack 626a-e can be swapped.

Figure 11:
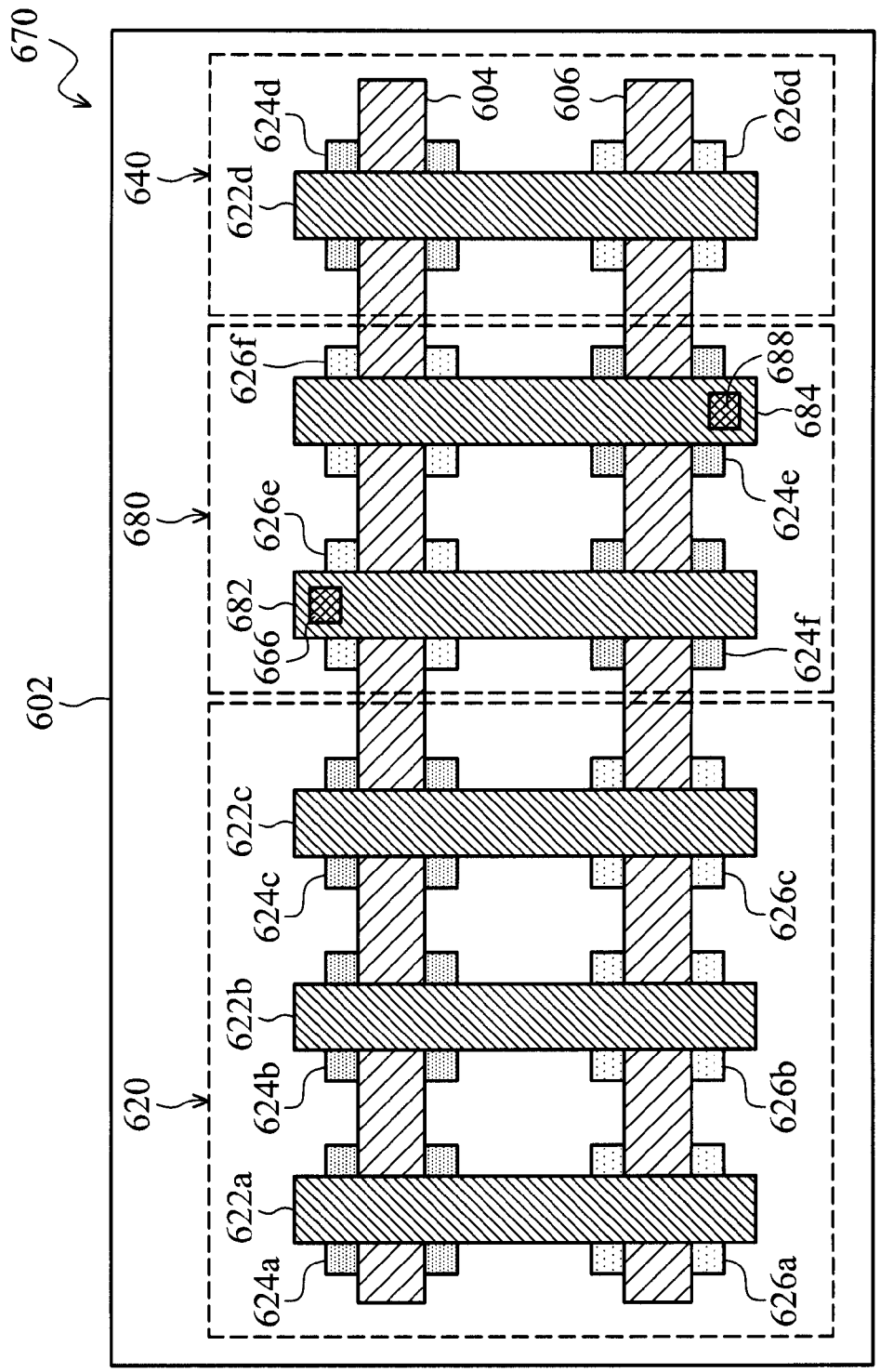

In some embodiments, a FinFET isolation unit may include extending a P-gate or a N-gate isolation structure as shown in FIG. 11. FIG. 11 is a layout example of a FinFET device 670 for implementing one or more embodiments of the present disclosure. The FinFET device 670 includes the substrate 602, the Fin PFET 604, the Fin NFET 606, the first FinFET cell 620, the second FinFET cell 640, and a FinFET isolation unit 680. The FinFET device 670 also includes first gate stacks 624a-f and second gate stacks 626a-f. The first gate stacks 624a-f include a first metal gate material. The second gate stacks 626a-f includes a second metal gate material. The first metal gate material is different from the second metal gat material at work function. The first FinFET cell 620 includes multiple gates 622a-622c. The second FinFET cell 640 includes multiple gates 622d. The FinFET isolation unit 680 includes a P-gate isolation structure 682, a N-gate isolation structure 684, a contact 686 and a contact 688. However, other configurations and inclusion or omission of devices may be possible. In some embodiments, the first FinFET cell 620 or the second FET cell 640 includes a logic or a function cell, such as an AND, an OR, a NAND, a NOR, an inverter, a DRAM or a SRAM cell. The FinFET isolation unit 680 can be used for more logic or function cells isolation on a FinFET device.

As shown in FIG. 11, the P-gate isolation structure 682 is an extension of the P-gate isolation structure 662 with reference to FIG. 10. The P-gate isolation structure 682 cross both the Fin PFET 604 and the Fin NFET 606. The P-gate isolation structure 682 includes the first gate stack 624f at the Fin NFET 604 and the second gate stack 626e at the Fin PFET 604. The P-gate isolation structure 682 is connected to the contact 686 formed in the substrate 602. The N-gate isolation structure 684 is an extension of the N-gate isolation structure 664 with reference to FIG. 10. The N-gate isolation structure 684 cross both the Fin NFET 606 and the Fin PFET 604. The N-gate isolation structure 684 includes the first gate stack 624e at the Fin NFET 606 and the second gate stack 626f at the Fin PFET 604. The P-gate isolation structure 682 is connected to the contact 688 formed in the substrate 602.

Figure 12:
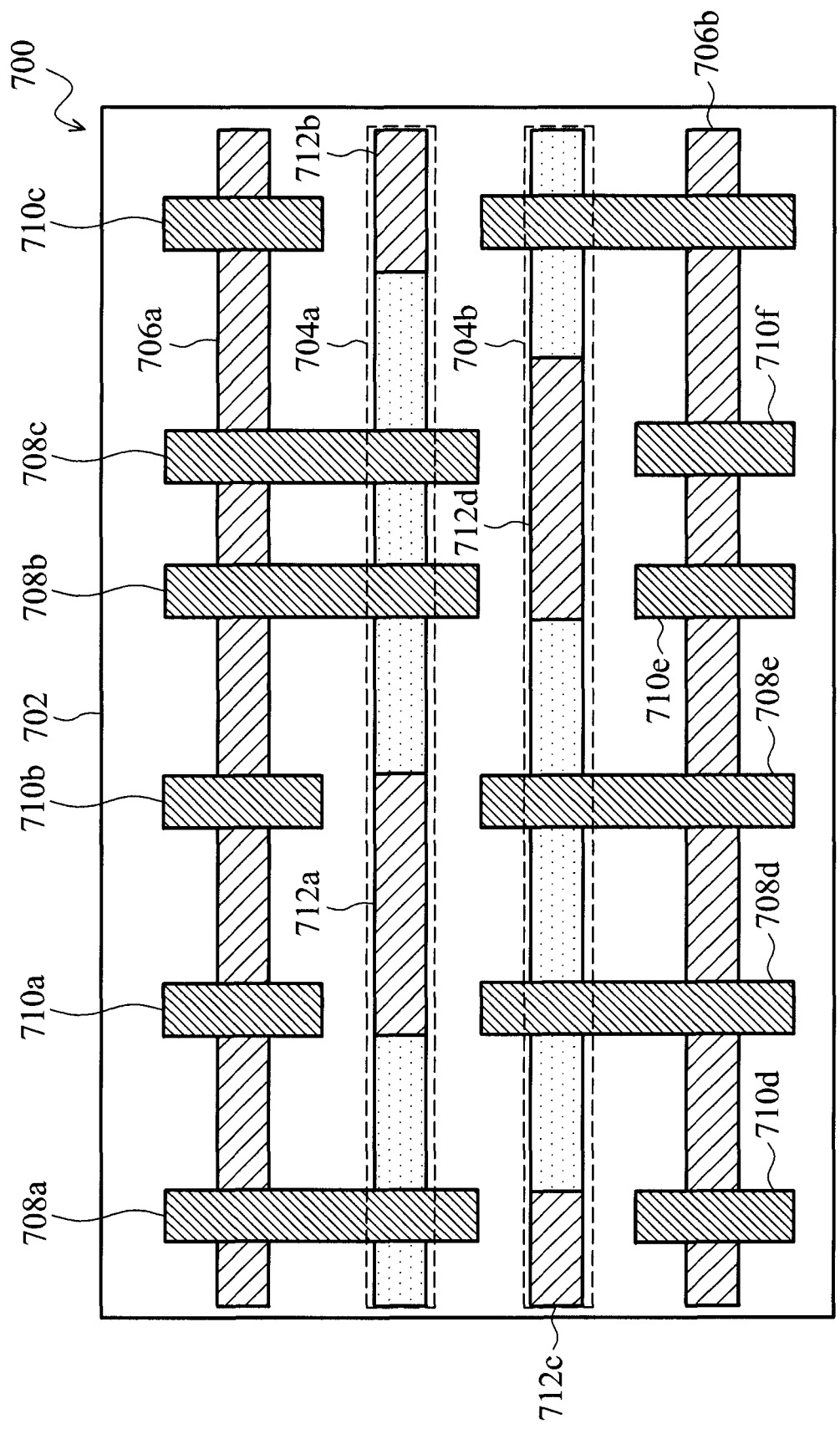

Referring to FIG. 12, a layout example of a FinFET device (SRAM) 700 using P+/N+ isolation is illustrated according to one or more embodiments of the present disclosure. The FinFET device 700 includes a substrate 702, a Fin PFET 704a, a Fin PFET 704b, a Fin NFET 706a, a Fin NFET 706b, multiple gates 708a-f and 710a-f, and isolation structures 712a-d. However, other configurations and inclusion or omission of devices may be possible. The substrate 702 includes all the materials used in the substrate 102 of the device 100 with reference to FIG. 1. The Fin PFET 704a and 704b are formed on the substrate 702. The Fin NFET 706a and 706b are formed on the substrate 702. The multiple gates 708a-c are formed over the Fin PFET 704a and the Fin NFET 706a on the substrate 702. The multiple gates 708d-f are formed over the Fin PFET 704b and the Fin NFET 706b on the substrate 702. The gates 710a-c are formed over the Fin NFET 706a. The gates 710d-f are formed over the Fin NFET 706a. The isolation structure 712a and 712b isolate the Fin-FET 704a. The isolation structure 712c and 712d isolate the FinFET 704b. In one embodiment, the isolation structures 712a-d are formed using a N+ or P+ counter doping without cutting or breaking the Fin PFET gate 704a or 704b. In other embodiments, the isolation structure 712a-d may be formed using an N-WELL or a P-WELL, a P-gate or a N-gate isolation structure, or combination thereof.

Thus, the present disclosure describes a layout. The layout includes a substrate, at least two fin field effect transistors (FinFET) cells formed in the substrate, multiple fins designed to be shared by the two cells, a plurality of gates formed on the substrate, and an isolation unit formed between the first FinFET cell and the second FinFET cell. The two FinFET cells include a first FinFET cell and a second FinFET cell. The FinFET gate may include a positive charge FinFET (Fin PFET) gate and a negative charge FinFET (Fin NFET) gate. The isolation unit isolates the first FinFET cell from the second FinFET cell without breaking the FinFET fins. The first FinFET cell includes at least one gate around the FinFET fin. The second FinFET cell includes at least one gate around the FinFET fin. The isolation unit includes a PFET isolation structure formed in Fin PFET. The PFET isolation structure further includes at least one P-gate isolation structure connecting a contact formed in the substrate. The P-gate isolation structure further includes an extended P-gate isolation structure. The PFET isolation structure further includes at least one N-WELL isolation structure. The PFET isolation structure further includes at least one N+ isolation structure. The isolation unit includes a NFET isolation structure formed in Fin NFET gate. The NFET isolation structure further includes at least a N-gate isolation structure connecting a contact formed in the substrate. The N-gate isolation structure further includes an extended N-gate isolation structure. The NFET isolation structure further includes at least one P-WELL isolation structure. The NFET isolation structure further includes at least one P+ isolation structure.

In some embodiment, a layout is described. The device includes a substrate, at least two fin field effect transistors (FinFET) cells formed in the substrate, a FinFET fin designed to cross the two FinFET cells, a plurality of gates formed on the substrate, and an isolation unit formed between the first FinFET cell and the second FinFET cell, wherein the isolation unit isolates the first FinFET cell from the second FinFET cell without breaking the FinFET fins. The two FinFET cells include a first FinFET cell and a second FinFET cell. The FinFET cells include a positive charge FinFET (Fin PFET) including a first metal gate material and a negative charge FinFET (Fin NFET) including a second metal gate material. The gates are formed around the FinFET fins. The isolation unit includes a P-gate isolation structure isolating the Fin PFET and an N-gate isolation structure isolating the Fin NFET. The P-gate isolation structure includes an extended P-gate isolation structure. The N-gate isolation structure includes an extended N-gate isolation structure. The first metal gate material is different from the second metal gate material for work function.

In other embodiments, a layout is described. The layout includes a substrate, at least two fin field effect transistors (FinFET) cells formed in the substrate, a FinFET fin crossing the two FinFET cells, a plurality of gates formed on the substrate, and an isolation unit isolating first FinFET cell and the second FinFET cell without breaking the FinFET fins. The two FinFET cells include a first FinFET cell and a second FinFET cell. The FinFET includes a positive charge FinFET (Fin PFET) gate and a negative charge FinFET (Fin NFET).

The isolation unit includes a P-gate isolation structure, a N-well isolation structure, or a N+ isolation structure or a combination thereof isolating the Fin PFET and a N-gate isolation structure, a P-WELL isolation structure, a P+ isolation, or a combination there of isolating the Fin NFET.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A layout comprising:
   at least two fin field effect transistor (FinFET) cells, wherein the at least two FinFET cells include a first FinFET cell and a second FinFET cell;
   a FinFET fin designed to cross the two FinFET cells, wherein the FinFET fin includes a positive charge FinFET (Fin PFET) fin and a negative charge FinFET (Fin NFET) fin;
   a plurality of gates formed over portions of the FinFET fin; and
   an isolation unit formed between the first FinFET cell and the second FinFET cell, wherein the isolation unit isolates the first FinFET cell from the second FinFET cell without breaking the FinFET fin, and wherein the isolation unit crosses the Fin PFET fin.

2. The layout of claim 1, wherein the first FinFET cell includes at least one gate around the FinFET fin.

3. The layout of claim 1, wherein the second FinFET cell includes at least one gate around the FinFET fin.

4. The layout of claim 1, wherein the isolation unit includes a PFET isolation structure formed in the Fin PFET fin.

5. The layout of claim 4, further comprising at least one P-gate isolation structure connecting one of the contacts formed in the substrate.

6. The layout of claim 5, further comprising an extended P-gate isolation structure.

7. The layout of claim 4, further comprising at least one N-WELL isolation structure.

8. The layout of claim 4, further comprising at least one N+ isolation structure.

9. The layout of claim 1, wherein the isolation unit includes a NFET isolation structure formed in the Fin NFET fin.

10. The layout of claim 9, further comprising at least one N-gate isolation structure connecting one of the contacts formed in the substrate.

11. The layout of claim 10, further comprising an extended N-gate isolation structure.

12. The layout of claim 9, further comprising at least one P-WELL isolation structure.

13. The layout of claim 9, further comprising at least one P+ isolation structure.

14. A layout comprising:
   at least two fin field effect transistor (FinFET) cells, wherein the at least two FinFET cells include a first FinFET cell and a second FinFET cell;
   a FinFET fin designed to cross the two FinFET cells, wherein the FinFET fin includes a positive charge FinFET (Fin PFET) fin including a first metal gate material and a negative charge FinFET (Fin NFET) fin including a second metal gate material;
   a plurality of gates formed around portions of the FinFET fin; and
   an isolation unit formed between the first FinFET cell and the second FinFET cell, wherein the isolation unit isolates the first FinFET cell from the second FinFET cell without breaking the FinFET fin, and wherein the isolation unit crosses the Fin PFET fin.

15. The layout of claim 14, wherein the isolation unit includes a P-gate isolation structure for isolating the Fin PFET fin and an N-gate isolation structure isolating the Fin NFET fin.

16. The layout of claim 15, wherein the P-gate isolation structure includes an extended P-gate isolation structure.

17. The layout of claim 16, wherein the N-gate isolation structure includes an extended N-gate isolation structure.

18. The layout of claim 14, wherein the first metal gate material is different from the second metal gate material at work function.

19. A layout comprising:
   a first fin field effect transistor (FinFET) cell and a second FinFET cell;
   a FinFET fin crossing the first and second FinFET cells, wherein the FinFET fin includes a positive charge FinFET (Fin PFET) fin and a negative charge FinFET (Fin NFET) fin;
   a plurality of gates formed over portions of the FinFET fin; and
   an isolation unit isolating the first FinFET cell and the second FinFET cell without breaking the FinFET fin, wherein the isolation unit crosses the Fin PFET fin.

20. The layout of claim 19, wherein the isolation unit includes a P-gate isolation structure, a N-well isolation structure, a N+ isolation structure or a combination thereof isolating the Fin PFET fin and a N-gate isolation structure, a P-WELL isolation structure, a P+ isolation, or a combination thereof.

* * * * *